United States Patent [19]

Bristol et al.

[11] Patent Number: 4,593,242

[45] Date of Patent: Jun. 3, 1986

[54] CONTROL CIRCUIT FOR A DELAYED SWEEP OSCILLOSCOPE

[75] Inventors: L. Rodney Bristol, Tigard; Alfred K. Hillman, Jr., Portland; William Q. Law, Beaverton, all of Oreg.

[73] Assignee: Tektronix, Inc., Beaverton, Oreg.

[21] Appl. No.: 545,560

[22] Filed: Oct. 26, 1983

[30] Foreign Application Priority Data

Nov. 19, 1982 [JP] Japan ................... 57-202230

[51] Int. Cl.⁴ ........................................ G01R 13/22
[52] U.S. Cl. ........................................ 324/121 R
[58] Field of Search ............... 324/121 R; 340/712, 340/753, 754, 802, 711, 713, 720, 749, 750, 798, 799

[56] References Cited

U.S. PATENT DOCUMENTS 3,879,722  4/1975  Knowlton ............... 340/712 X
4,372,054  2/1983  Pomerantz et al. ....... 340/802 X

OTHER PUBLICATIONS

Rolfe, D., "Internal Computer Automates Oscilloscope", Electronic Product Design, Oct. 1980, pp. 45-48.

Primary Examiner—Stewart J. Levy
Assistant Examiner—Stephen M. Baker
Attorney, Agent, or Firm—George T. Noe

[57] ABSTRACT

In accordance with the present invention, a control circuit for operating a delayed sweep oscilloscope includes a reversible counter which may be selectively incremented or decremented to establish a number of trigger-circuit operating functions and modes, such as trigger source selection, coupling, level, and sweep mode. A plurality of light sources behind a plastic overlay laminated to the front panel indicate the various functions and modes.

4 Claims, 7 Drawing Figures

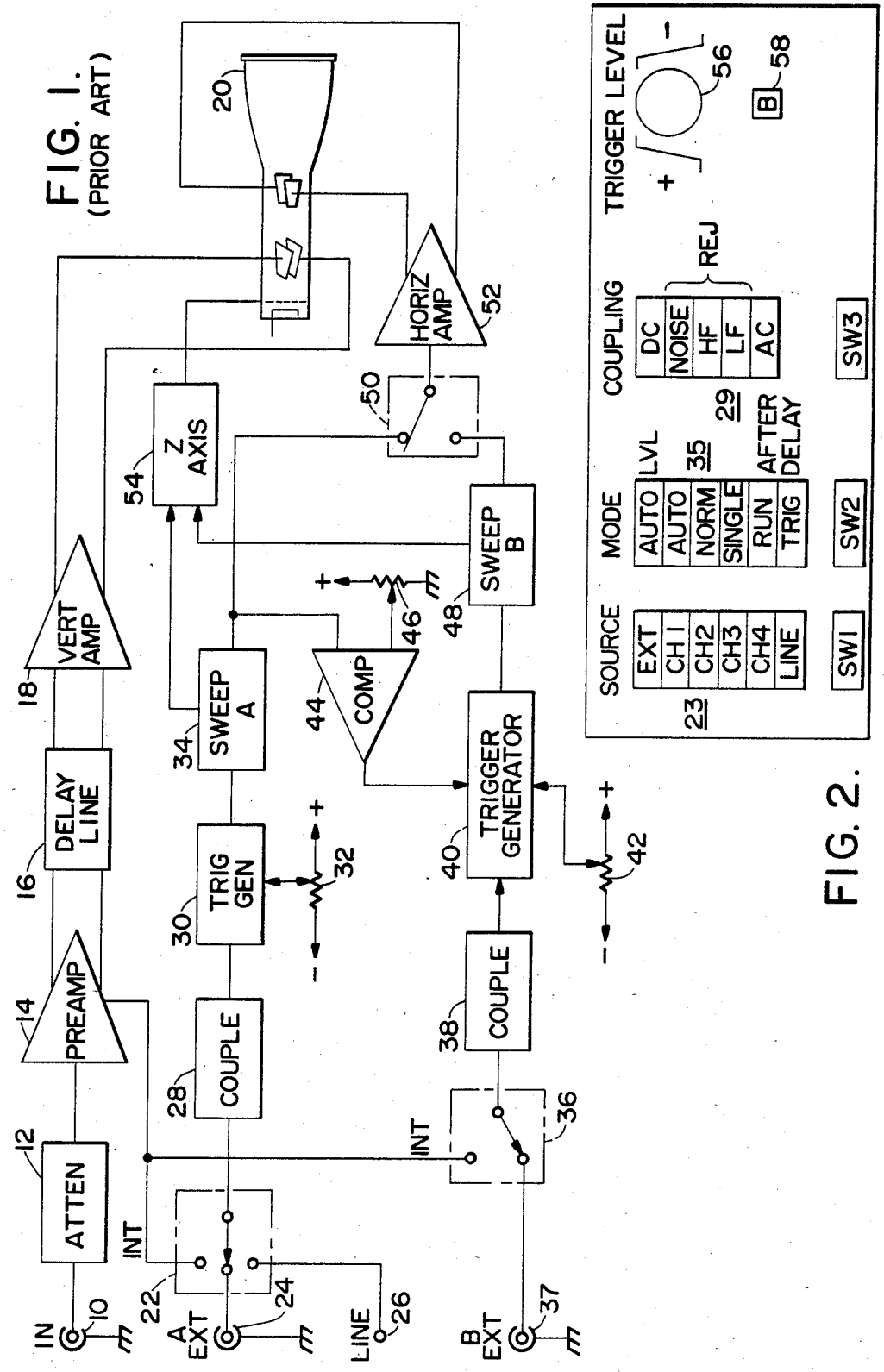

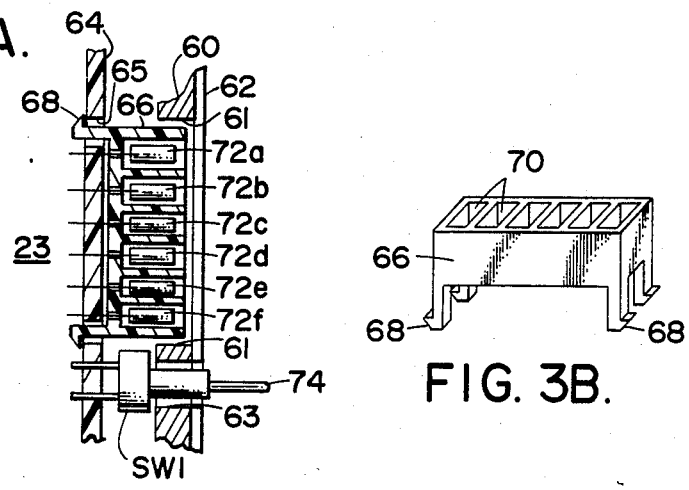
FIG. 3A.
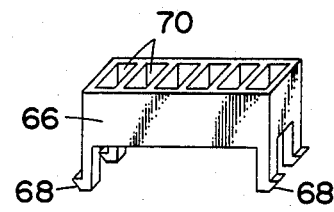
FIG. 3B.
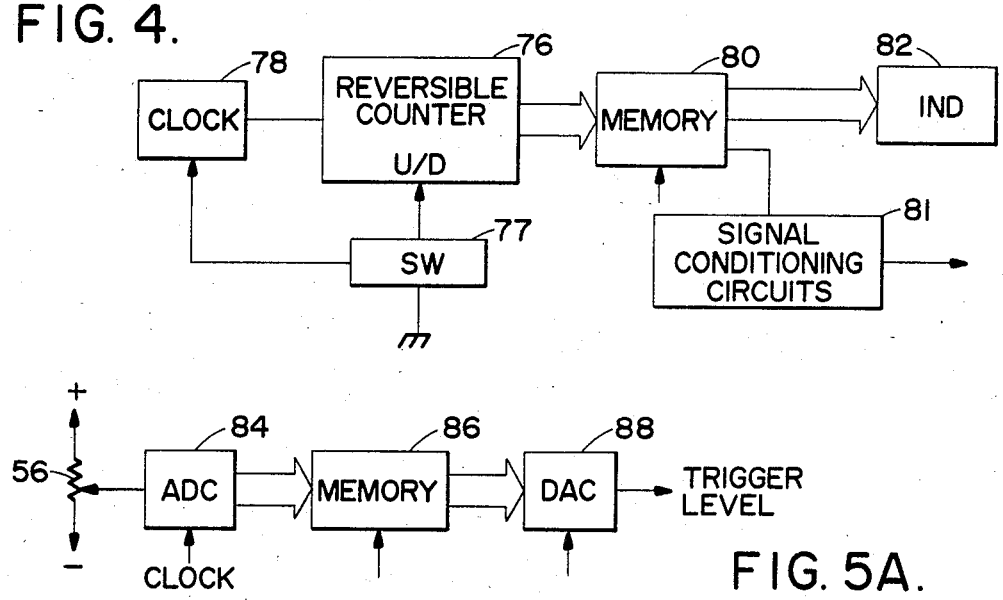
FIG. 4.
FIG. 5A.
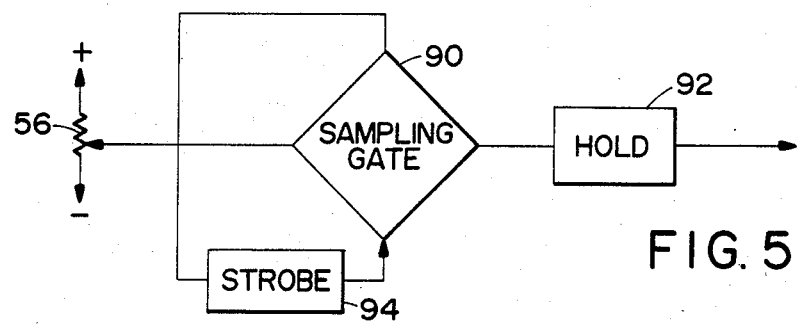
FIG. 5B.

4,593,242

CONTROL CIRCUIT FOR A DELAYED SWEEP OSCILLOSCOPE

BACKGROUND OF THE INVENTION

This invention relates generally to a control circuit for a delayed sweep oscilloscope, and more particularly to a circuit for selecting trigger source, coupling, trigger level, and sweep mode of a delayed sweep oscilloscope.

A block diagram of a conventional delayed sweep oscilloscope is shown in FIG. 1 for better understanding of this invention. Applied to input terminal 10 is an input signal to be observed which is ultimately applied to the vertical deflection plates of cathode-ray tube (CRT) 20 through controllable attenuator (ATT) 12, preamplifier 14, delay line circuit 16 and vertical output amplifier 18. Trigger source circuit 22 is used to select trigger signals from various sources including internal (INT), external (EXT) and power line (LINE) trigger signal sources. The internal trigger signal is derived from vertical preamplifier 14. Although only one vertical channel is shown in this example, most laboratory oscilloscopes include two or more vertical channels. For multi-channel oscilloscopes, internal trigger signals are derived from each channel. The external trigger signal is applied to A EXT connector 24. The LINE trigger signal is coupled to LINE terminal 26 for displaying signals from any power line frequency related circuits. The selected trigger signal from trigger source circuit 22 is applied to trigger coupling circuit 28 for selecting either AC, DC, low frequency reject (LF REJ), or high frequency reject (HG REJ) modes. The trigger signal passed through coupling circuit 28 is then applied to trigger generator 30 for regenerating a fast trigger pulse by comparing the level of such trigger signal with a controllable trigger level from A TRIG LEVEL potentiometer 32. The output trigger pulse from trigger generator 30 is used to initiate A sweep generator 34. A sweep signal from A sweep generator 34 is applied to the horizontal deflection plates of CRT 20 by way of sweep mode selection switch 50 and horizontal output amplifier 52.

B sweep circuitry is essentially the same as the aforementioned A sweep circuitry including trigger source circuit 36, B EXT connector 37, trigger coupling circuit 38, trigger generator 40, B trigger level control potentiometer 42, and B sweep generator 48. The B sweep signal from B sweep generator 48 is also applied to the horizontal deflection plates of CRT 20 by way of switch 50 and horizontal output amplifier 52. Additionally, delay comparator 44 is utilized to compare the A sweep signal with a delay time control potentiometer or delay time position (DTP) potentiometer 46. The comparator output is applied to trigger circuit 40. Although not shown in FIG. 1, trigger circuits 30 and 40 are so designed to operate in either automatic level (AUTO LVL), automatic (AUTO), normal (NORM), or single (SINGLE) mode. The AUTO LVL is a trigger mode to trigger on any desired percentage of the waveform regardless of the DC level and amplitude of the trigger signal as disclosed in U.S. Pat. No. 3,879,669 to Moriyasu. For this purpose, a peak-to-peak trigger signal detector is employed to set both extreme voltages of the trigger level control potentiometer. The AUTO mode is used to free run the sweep generator when the trigger generator is not properly generating trigger pulses at a certain repetition rate higher than a predetermined frequency, e.g. 50 Hz. One example of the AUTO mode is disclosed in U.S. Pat. No. 3,215,948 to Oliver Dalton and includes a trigger pulse interval measurement circuit. The NORM mode is used to initiate the sweep generator only when the trigger signal level crosses the trigger level set by TRIG LEVEL potentiometer 42. No waveform or trace is displayed if not triggered. The B sweep generator has two modes that are different from the A sweep generator. One is run after delay (RUN) and the other is triggerable after delay time (TRIG). In the RUN mode, B sweep generator 48 is only armed by the delay trigger pulse but is triggered (or initiated) on receiving the next subsequent trigger signal from trigger coupling circuit 38.

Sweep mode selection 50 is used to select either the normal sweep from A sweep generator 34 or the delayed sweep signal from B sweep generator 48 to be amplified by horizontal output amplifier 52 for driving the horizontal deflection plates. Sweep gate pulses from A and B sweep generators 34 and 48 are combined together in Z-axis amplifier 54 to control the control grid bias of CRT 20. Sweep mode switch 50 selects the normal sweep signal for observing the entire waveform including the interesting portion to be magnified by the delayed sweep. When selecting the delayed sweep by sweep mode switch 50, only the interesting portion is displayed on the magnified scale.

Control switches for trigger source and coupling selection purposes may be a level control type rotary switch including a control level and a plurality of switch contacts provided directly on an electrical circuit board and a programmable switch actuator cam member.

A disadvantage of the conventional control circuit for a delay sweep oscilloscope is the need for many controls and switches in addition to their indicators to be mounted for both A and B sweep circuits on the front panel despite essentially identical purposes for both sweep circuits. This problem becomes increasingly serious as the number of signal channels increases, such as, for example, a four channel oscilloscope. In addition, these controls and switches for the B sweep circuit are less frequently used as compared with those for the A sweep circuit. It is also very hard to obtain more than five different selections by using a conventional lever switch.

The subject matter of this invention is the use of a single up/down control switch for sequentially or step-by-step selection of a plurality of different modes by continuously or intermittently operating the switch and a common indicator which is preferably made of a plastic overlay on the front panel including a plurality of light sources, e.g. LEDs (light emitting diodes) behind the plastic overlay. Such selection switches and indicators are commonly used for both A and B sweep circuits. Additionally, a single trigger control potentiometer is used for both sweep circuits. Normally, the selection switches, indicators and trigger level control are used for controlling or selecting the switches or potentiometer setting of the A sweep circuit but they may be used for the same purposes of the B sweep circuit by using a shift switch.

It is therefore an object of this invention to provide a simplified control circuit for a delayed sweep oscilloscope.

It is another object of this invention to provide an improved control and indicator apparatus for a delayed sweep oscilloscope.

It is yet another object of this invention to provide a control circuit for a delayed sweep oscilloscope wherein only a single control and indicator are normally used for the A sweep circuit and may also be used for the B sweep circuit as necessary without causing operational inconvenience.

These and other objects as well as construction and advantages will become apparent to those skilled in the art upon reading the following description of the invention when taken in conjunction with the accompanying drawings.

DRAWINGS

FIG. 1 is a block diagram of a conventional delayed sweep oscilloscope;

FIG. 2 is a simplified sketch of various controls and indicators on an oscilloscope front panel according to this invention;

FIG. 3A shows a simplified mechanical construction of the control and indicators according to one embodiment of this invention;

FIG. 3B shows a perspective view of the LED holder for use in the present invention;

FIG. 4 is a block diagram of the control circuit according to this invention; and FIGS. 5A and 5B show respectively two methods of converting the trigger level voltage to a stored value.

DETAILED DESCRIPTION OF THE INVENTION

FIG. 2 shows controls and indicators 23, 29 and 35 on the front panel of a delayed sweep oscilloscope according to this invention. Trigger SOURCE control switch SW1 is positioned at the left bottom in this particular embodiment, which may be an up/down level switch for selecting either external (EXT), internal (CH1, CH2, CH3 and CH4), or power line (LINE) trigger source. Such selected setting is indicated by SOURCE indicator 23. Assuming now that the EXT trigger source is selected at a certain instance, the EXT indicator is lit by an LED (light emitting diode) or an incandescent lamp. CH1 source is selected and indicated by pushing down SW1 once. Similarly, CH2, CH3, ... LINE source will be selected sequentially along with lighting the respective indicator. On the other hand, the trigger source is switched sequentially from LINE, CH4, ..., EXT when pushing SW1 up. The selection may advance in step-by-step increments by pushing SW1 up or down, and in a continuous or sequential manner if SW1 is held up for some longer period of time. Indicators for the internal sources CH1 through CH4 may be lit by green LEDs while EXT and LINE indicators by red or other color LED for operator's convenience.

Trigger MODE switch SW2 may be implemented and operated in the same manner and the selected setting is indicated by MODE indicator 35. Up/down mode selection switch SW2 is pushed up or down to select any of AUTO LVL, AUTO, NORM, or SINGLE modes for the A sweep circuit. Trigger COUPLING switch SW3 is pushed up or down to select any of DC, AC or HF, LF or NOISE REJ coupling modes. Such setting is also indicated by COUPLING indicator 29.

Settings of A trigger SOURCE 22, A COUPLING 28 and sweep MODE of A sweep generator 34 may be set to their desired modes by using SW1 through SW3. Such settings may be stored in a memory such as a RAM (random access memory) of a microprocessor (MPU). A proper trigger level for the A sweep generator 34 may be controlled by using a single TRIG LEVEL control potentiometer 56.

All the controls and the indicators are used for the B sweep circuit in accordance with this invention. For conditioning of the B sweep circuit, B selection switch 58 is energized. Then, switches SW1 through SW3 are pushed up and down to choose any desired SOURCE, COUPLING and MODE selections in a similar manner as for the A sweep circuit. The only difference is the selection of either RUN or TRIGgerable after delay mode of the MODE switch. They may be indicated in different color light from the other indicators. A desired trigger level for B trigger generator 40 may be selected by using TRIG LEVEL control 56. All the settings are now stored in different addresses of the memory, e.g. the RAM of the MPU mentioned hereinbefore. As will be described below, the B trigger level is preferably digitized before being stored in the memory.

In this manner, both controls for the A and B sweep circuits may be set to desired settings and are indicated clearly, as necessary, by pushing or releasing B selection switch B. All the switches in the SOURCE, COUPLING and MODE selection circuits are electrical relays, analog switches or any other electronically controllable switches that are under control of the memory outputs.

FIGS. 3A and 3B show respectively a cross section view of the trigger SOURCE indicator section 23 and a perspective view of the LED holder according to one preferred embodiment of this invention. Oscilloscope front panel 60 may be made of one or more laminated aluminum plates having openings 61, 63, and also covered by a transparent or semi-transparent plastic plate 62 which may be preferably color coded for user's convenience. Electrical circuit board 64 is provided in parallel with front panel 60 and spaced therefrom by a certain distance. LED holder 66 and control switch SW1 are mounted on electrical circuit board 64. LED holder 66 suitably may be made of light opaque molded plastic material and has a plurality of (e.g. six) cells 70 for accommodation of LEDs 72a, 72b, ..., 72f. LED holder 66 may be a unitary structure having four resilient legs 68 to be inserted in openings 65 of electrical circuit board 64. LED holder 66 is aligned with opening 61 to directly interface to plastic overlay plate 62 thereby to illuminate indication characters (not shown) such as EXT, CH1, ... when the respective LEDs are energized by the driving circuitry provided on electrical circuit board 64. Control switch SW1 is mounted on electrical circuit board 64 by soldering its terminals in such a manner that the control lever 74 is extending through the front panel 60 through opening 63. Switch SW1 may be of any conventional design and may be mounted directly on the front panel by conventional hardware.

FIG. 4 shows a simplified block diagram of the control system to be used for conditioning SOURCE, COUPLING and MODE switches 23, 29 and 35 in FIG. 2. Counter 76 is a reversible counter to count up or down on receiving clock pulses from clock generator 78 under control of control switch 77. The contents of reversible counter 76 are stored in memory 80 for controlling indicator 82. In this particular example, on momentarily pushing switch 77 up (or down), clock generator 78 generates a single pulse to increment or decrement counter 76 by one count. A clock pulse train is generated at a predetermined rate (e.g. at every one second) if control switch 77 is left in the up or down position for an extended period of time. Memory 80 reads the contents of counter 76 at a constant readout cycle to update the memory and the updated setting is supplied to indicator 82 to provide the correct corresponding indication.

FIGS. 5A and 5B show respectively digital and analog types memory for storing the trigger level setting for subsequent use by trigger generators. In FIG. 5A, the trigger level selected by trigger level control 56 is digitized periodically by ADC (analog-to-digital converter) 84 under control of a clock pulse, and stored in memory 86. The stored data is again converted into an analog voltage by DAC 88 before being applied to the respective trigger generator. MEM 86 may be a RAM of an MPU for storing both A and B trigger levels in the designated memory locations (addresses) during A and B memory cycles. Alternatively, the trigger levels may be stored by an analog technique as shown in FIG. 5B by using sampling gate 90 and hold circuit 92. Sampling gate 90 is under control of strobe generator 94 which may be actuated whenever the operator readjusts trigger level control 56. Such actuation may be performed by monitoring the difference between the input to sampling circuit 90 and the output of hold circuit 92. Hold circuit 92 may include active devices and circuitry to maintain the sample voltage until it is renewed.

As is understood from the foregoing description, this invention is made to improve the spare factor on an oscilloscope front panel without sacrificing the operational convenience. That is, at least one of trigger source, coupling and mode in addition to trigger level are controlled by respective common controls for both A and B sweep circuits. Additionally, each control along with associated electronic circuitry sequentially selects any desired setting from among a plurality of settings and these selections are indicated adjacent to the control switch. A plurality of LEDs of any desired color are positioned to light a respective indicator printed on a plastic plate over the front panel. These controls and indicators are used normally for the A sweep circuit, which is more frequently used, but also used for the B sweep circuit as necessary by energizing an additional switch. All the settings are lighted by an indicator and may be readjusted as necessary.

Although only a preferred embodiment of this invention is shown and described hereinbefore, it is understood that many modifications may be made to best fit a particular application without departing from the subject matter of this invention.

What I claim is:

1. A control circuit for an oscilloscope having a normal sweep circuit and a delayed sweep circuit, comprising:
    electronic control means for selecting at least one of a trigger source and a coupling from a plurality of trigger sources and couplings;
    indicator means for indicating the selected setting of said electronic control means;
    switch means for enabling said electronic control means to control the setting for the normal sweep circuit and for the delayed sweep circuit; and
    memory means coupled to said electronic control means and to said indicator means for storing the settings selected by said electronic control means.

2. A control circuit for an oscilloscope according to claim 1, wherein said indicator means comprises a plastic plate having indication characters printed thereon and a plurality of LEDs provided behind said plastic plate.

3. A control circuit for an oscilloscope acording to claim 1, wherein said LEDs emit different colors for different functions.

4. A control circuit for an oscilloscope according to claim 1, wherein said electronic control means comprises a reversible counter.

* * * * *